United States Patent [19]

Masuda

[11] Patent Number: 4,786,824
[45] Date of Patent: Nov. 22, 1988

[54] INPUT SIGNAL LEVEL DETECTING CIRCUIT

[75] Inventor: Eiji Masuda, Kawasaki, Japan

[73] Assignee: Kabushiki Kaisha Toshiba, Kawasaki, Japan

[21] Appl. No.: 613,634

[22] Filed: May 24, 1984

[51] Int. Cl.[4] .................... H03K 3/013; H03K 3/295; H03K 3/15; H03K 3/86

[52] U.S. Cl. ................... 307/290; 307/279; 307/268; 307/601; 307/602

[58] Field of Search ............... 307/279, 290, 291, 594, 307/605, 606, 354, 360, 351, 268, 580, 581, 582, 583, 584, 585, 443, 289, 601–603, 445, 542; 377/79

[56] References Cited

U.S. PATENT DOCUMENTS

| | | | |
|---|---|---|---|
| 3,631,528 | 12/1971 | Green | 307/570 |
| 3,767,938 | 10/1973 | Kueper | 307/291 X |
| 3,829,714 | 8/1974 | Vittoz | 307/279 |
| 3,851,189 | 11/1974 | Moyer | 307/279 |
| 3,971,960 | 7/1976 | Means et al. | 307/291 X |
| 3,976,949 | 8/1976 | Hepworth et al. | 307/279 X |
| 3,984,703 | 10/1976 | Jorgensen | 307/290 X |
| 4,239,994 | 12/1980 | Stewart | 307/279 X |
| 4,250,406 | 2/1981 | Alaspa | 377/79 X |
| 4,508,983 | 4/1985 | Allgood et al. | 307/577 |
| 4,544,850 | 10/1985 | Tarleton | 307/443 X |
| 4,575,646 | 3/1986 | Saneski | 307/601 X |
| 4,583,008 | 4/1986 | Grugett | 307/443 X |
| 4,629,909 | 12/1986 | Cameron | 307/443 X |

FOREIGN PATENT DOCUMENTS

0454365 8/1970 Japan .
0025755 3/1978 Japan .

*Primary Examiner*—Stanley D. Miller
*Assistant Examiner*—David R. Bertelson
*Attorney, Agent, or Firm*—Finnegan, Henderson, Farabow, Garrett and Dunner

[57] ABSTRACT

An input signal level detecting circuit includes a first inverter group circuit having first and second inverters connected in series, and a second inverter group circuit having third and fourth inverters connected in series. The input terminals of the first and third inverters are supplied with a signal having first and second levels to be detected. The output terminals of the second and fourth inverters are connected to set and reset terminals of the flip-flop circuit. When the mean level of the first and second levels is $V_{TM}$ and the threshold voltages of the first to fourth inverters are $V_{T1}$ to $V_{T4}$, respectively, the relations $V_{T1} > V_{TM}$; $V_{T2} < V_{TM}$; $V_{T3} < V_{TM}$ and $V_{T4} > T_{TM}$ are satisfied.

3 Claims, 6 Drawing Sheets

F I G. 2
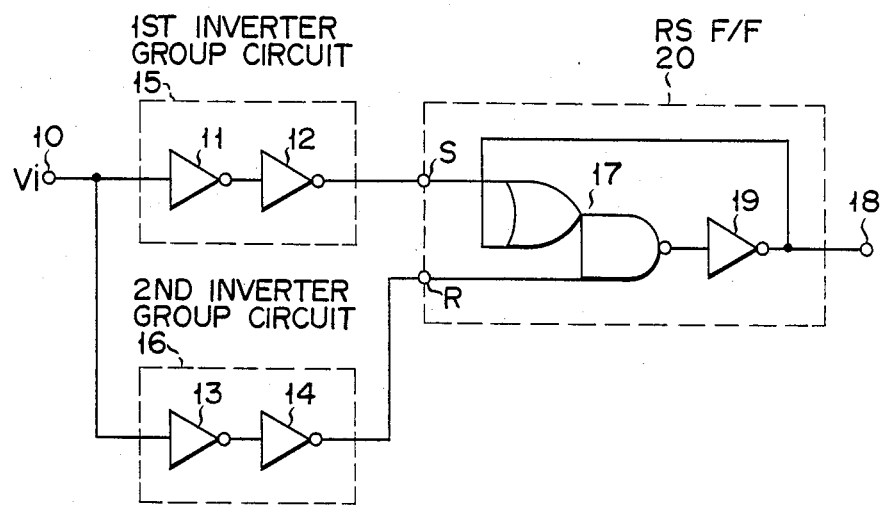

INPUT SIGNAL LEVEL DETECTING CIRCUIT

BACKGROUND OF THE INVENTION

The present invention relates to an input signal level detecting circuit made up of CMOS-FET's (complementary metal oxide semiconductor field effect transistors), and more particularly to an input signal level detecting circuit well adapted for an arrangement of a Schmitt trigger circuit.

Since the input signal level detecting circuit according to the present invention is suitable for the Schmitt trigger circuit, the present invention will be described with relation to the Schmitt trigger circuit. A typical example of prior Schmitt trigger circuits is disclosed in Japanese patent publication No. 25755/53 (1978). The Schmitt trigger circuit disclosed will briefly be described with reference to FIG. 1. In FIG. 1, an input signal is supplied to an inverter circuit 2 made up of CMOS transistors, through an input terminal 1. The Schmitt trigger circuit further contains a set-reset flip-flop circuit (RS F/F) 5 in which two-input NAND gate circuits 3 and 4 comprised of CMOS transistors are arranged as shown. A set terminal S is connected to an output terminal of the inverter circuit 2, while a reset terminal R is connected to the input terminal 1. A set output Q is derived from a terminal 6, while a reset output $\overline{Q}$ is derived from a terminal 7. In the circuit, the single inverter circuit 2 is provided between the input terminal 1 and the set terminal S of the RS F/F so that the threshold voltage of the inverter circuit 2 during the rise time of the input signal is higher than that of the inverter circuit 2 during the fall time of the input signal. With this arrangement, the output voltage of the inverter circuit 2 has a hysteresis characteristic. Those threshold voltages in the rise and fall times of the input signal changes depend on a manufacturing condition of the CMOS's, so that the threshold voltages frequently have great deviations from their set values. This results in a change of the hysteresis voltage width in the output of the inverter 2. As shown, the inverter circuit 2 is inserted only between the input signal terminal 1 and the set input terminal 8 of the RS F/F. Therefore, it is difficult to freely set the threshold voltages of the inverter 2 for the rise and fall times of the input signal. Therefore, the Schmitt trigger circuit as shown in FIG. 1 is not suitable if a large hysteresis voltage width is required.

SUMMARY OF THE INVENTION

Accordingly, an object of the present invention is to provide an input signal level detecting circuit which can set the threshold voltages at desired values. An input signal level detecting circuit according to the present invention comprises a first inverter group circuit connected between a signal input terminal to which an input signal is supplied and a first output terminal and including at least a first inverter which is connected, at the input, to the signal input terminal and a second inverter which is connected, at the input terminal, to the output terminal of the first inverter; a second invrter group circuit connected between the signal input terminal and a second output terminal and including at least a third inverter which is connected, at the input, to the signal input terminal and a fourth inverter which is connected, at the input terminal, to the output terminal of the third inverter; and a set-reset flip-flop circuit including a plurality of CMOS-FET's (complementary oxide semiconductor field effect transistors) and having input terminals connected to the first and second output terminals of the first and second inverter group circuits.

Each of the first to fourth inverters is formed of CMOS-FET's, the input signal has a first level to be detected at the rising region and a second level to be detected at the falling region, the second level being lower than the first level and the mean level of the first and second levels being defined as a reference level, and the threshold voltages of the first to fourth inverters are selected such that the threshold voltage of the first inverter is higher than the reference level, that of the second inverter is lower than the reference level, that of the third inverter is lower than the reference level and that of the fourth inverter is higher than the reference level. According to the invention, the hysteresis voltage width of an output signal from the Schmitt trigger circuit can be set at a desired value. Further, the threshold voltage values of the respective detecting circuits can easily be held at the set values regardless of changes of the fabricating conditions of CMOS's.

BRIEF DESCRIPTION OF THE DRAWINGS

FIG. 2 is a block diagram of an embodiment of a Schmitt trigger circuit incorporating an input signal level detecting circuit according to the present invention;

DETAILED DESCRIPTION OF THE PREFERRED EMBODIMENTS

Figure 4:
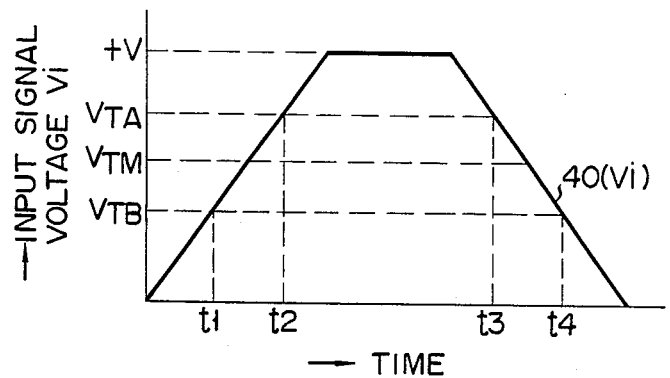
FIG. 4 shows a waveform of an input signal applied to the Schmitt trigger circuit shown in FIG. 3.
Figure 5:
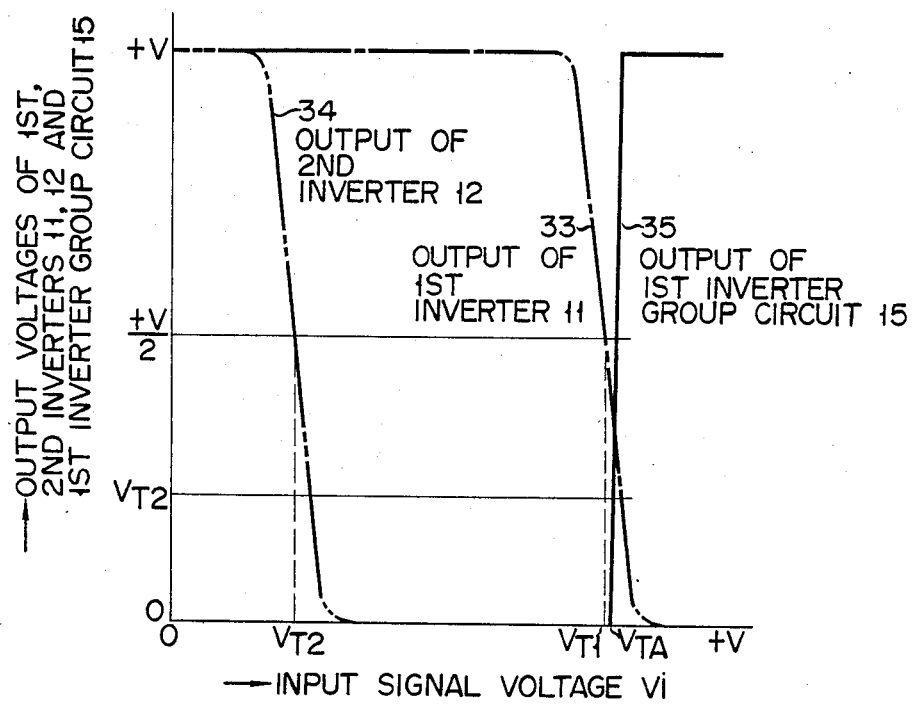
FIG. 5 graphically shows input vs. output relationships of a first level detecting circuit shown in FIG. 3.
Figure 6:
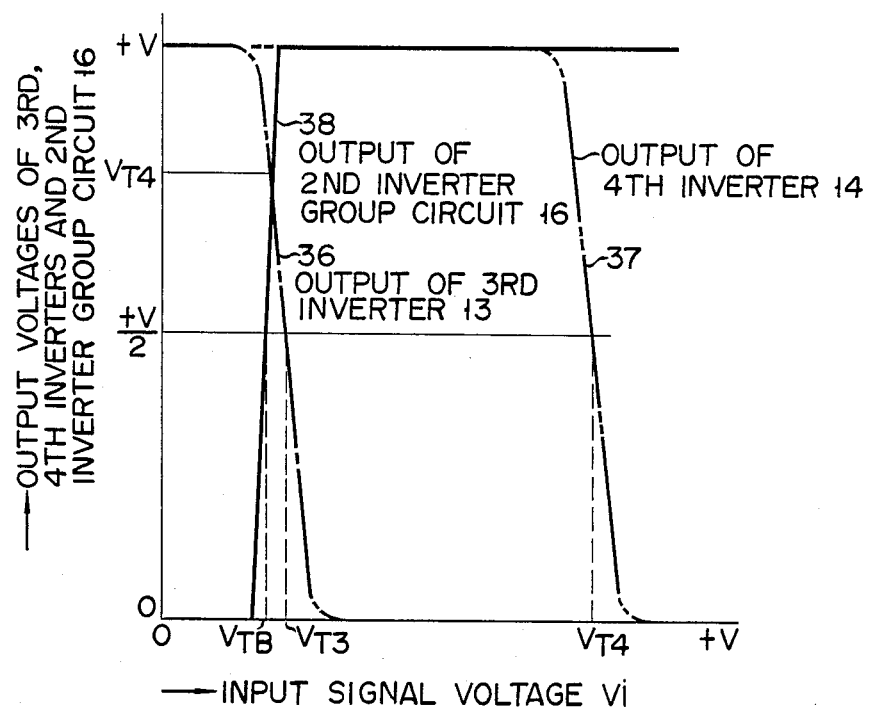
FIG. 6 graphically shows input vs. output relationships of a second level detecting circuit shown in FIG. 3.

In FIG. 2, a first inverter 11 and a second inverter 12, which are connected in a cascade fashion, make up a first inverter group circuit or a first level detecting circuit 15. A third inverter 13 and a fourth inverter 14, both connected Similarly, make up a second inverter group circuit or a second level detecting circuit 16. Those inverters are constructed of CMOS's. The first inverter 11 and the third inverter 13 are connected at the inputs to an input terminal 10 to which an input signal is supplied. An RS F/F circuit 20 includes an OR/NAND circuit 17 which is connected at the input terminals to a set terminal S and a reset terminal R, and an inverter 19 connected to the OR/NAND circuit 17 and for feeding back its output signal to the OR/NAND circuit and further to an output terminal 18. The set terminal S of the RS F/F circuit 20 is connected to the output terminal of a first inverter circuit 15 and the reset terminal R is connected to the output terminal of a second inverter circuit 16. The inverter 19 is constructed of CMOS's. The waveform of the input signal Vi to be supplied to the signal input terminal 10 is shown in FIG. 4, as an example. In FIG. 4, a first level $V_{TA}$ to be detected in the rising region and a second level $V_{TB}$ to be detected in the falling region are shown. The level $V_{TB}$ is lower than the level $V_{TA}$. The mean level of the first and second levels $V_{TA}$ and $V_{TB}$ is defined as a reference level $V_{TM}$. Thus, the threshold voltage of the first inverter 11 is set to be higher than $V_{TM}$, that of the second inverter 12 is set to be lower than $V_{TM}$, that of the third inverter 13 is set to be lower than $V_{TM}$, and that of the fourth inverter 14 is set to be higher than $V_{TM}$.

Figure 1:
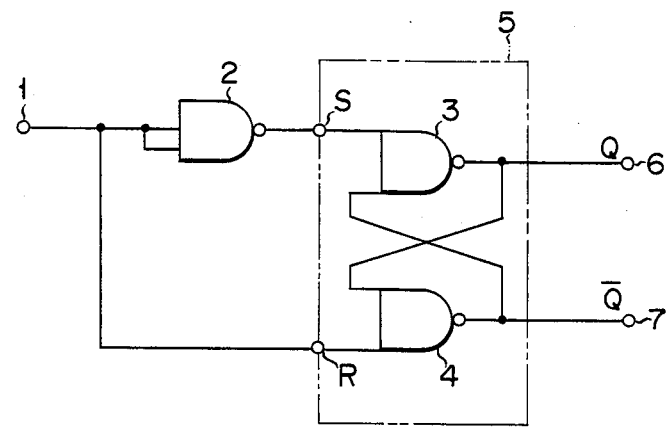
FIG. 1 shows a block diagram of an example of a Schmitt trigger circuit of the prior art.
Figure 3:
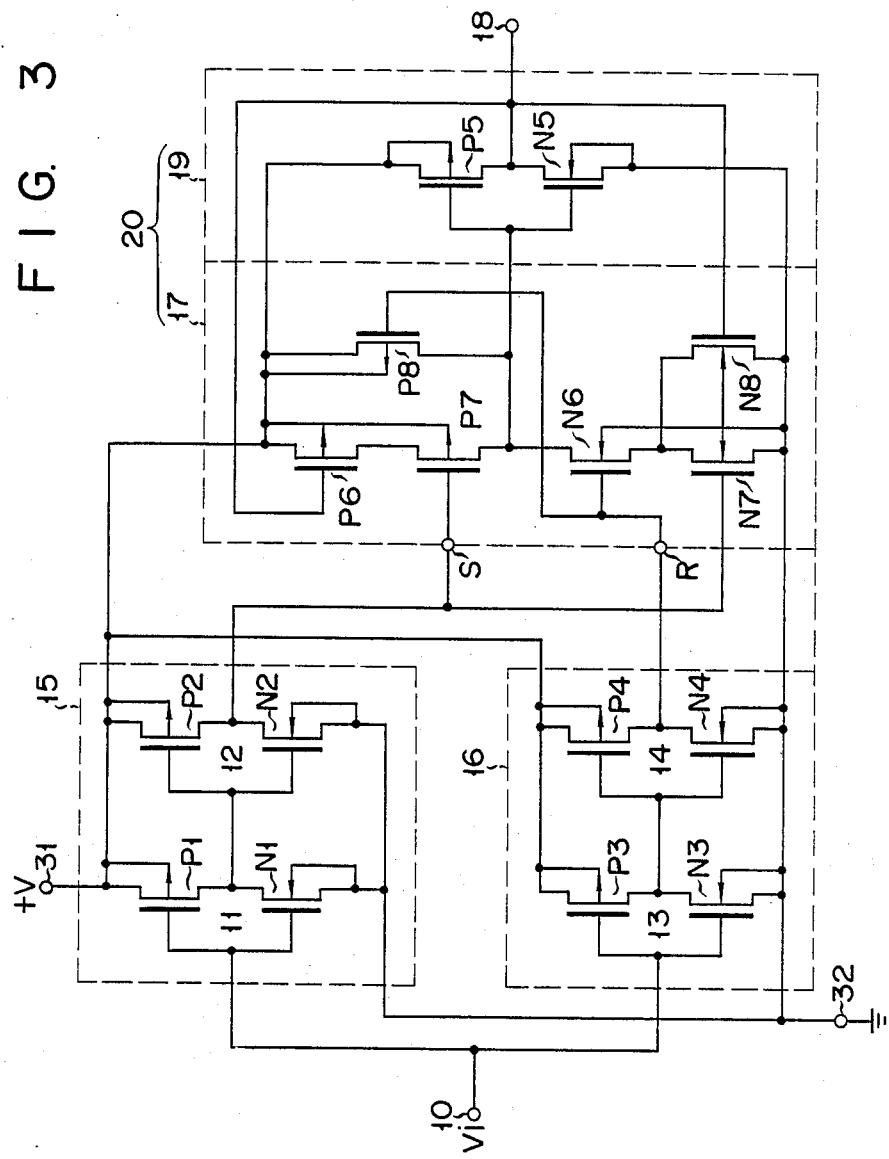
FIG. 3 is a detailed circuit diagram of the Schmitt trigger circuit shown in FIG. 2.

Turing now to FIG. 3, there is shown a Schmitt trigger circuit in corporating a level detecting circuit according to the present invention. In the figure, P1 to P8 are P-channel MOS transistors and N1 to N8 are N-channel MOS transistors. First to fourth inverters 11, 12, 13 and 14 include respectively complementary MOS transistors P1 and N1; P2 and N2; P3 and N3; and P4 and N4. An OR/NAND gate 17 includes transistors P6 to P8 and N6 to N8. The inverter 19 includes complemetary MOS transistors P5 and N5.

A first power source terminal 31 supplied with voltage +V is connected to the sources of transistors P1 to P6 and P8. A second power source terminal 32 held at a ground potential is connected to sources of transistors N1 to N5, N7 and NB. Back gate electrodes of the transistors P1 to P8 are connected to the first power source terminal 31, and back gate electrodes of the transistors N1 to N8 are connected to the second power source terminal 32. An output of the first inverter group circuit 15 is applied to gates of the transistors P7 and N7. An output of the second inverter group circuit is applied to gates of the transistors N6 and P8. Drains of the transistors P7 and N6 are connected to a drain of the transistor P8 and gates of transistors P5 and N5. A junction point of the drain-source paths of the transistors N6 and N7 is connected to a drain of the transistor N8. An output terminal of the inverter 19 is connected to gates of the transistors P6 and N8 and further to an output terminal 18 of the Schmitt trigger circuit.

The operation of the Schmitt trigger circuit shown in FIG. 3 will be described by using a case where an input signal Vi with a waveform shown in FIG. 4 is applied to a signal input terminal 10. In FIG. 4, an abscissa represents timings t1 to t4, while an ordinate represents instantaneous values of the input signal Vi with respect to those timings. The operations of the first inverter group circuit 15 (a first input signal detecting circuit) and the second inverter group circuit 16 (a second input signal detecting circuit) will first be described.

The threshold voltages $V_{T1}$ to $V_{T4}$ of the first to fourth inverters 11 to 14 are previously set so as to satisfy the following relations; $V_{T1} > V_{TM}$; $V_{T2} < V_{TM}$; $V_{T3} < V_{TM}$ and $V_{T4} > V_{TM}$. The threshold voltage means an input voltage to the inverter circuit when an output voltage of the inverter corresponding to the threshold voltage is an average value of the voltages at the first and second power source terminals 31 and 32 ($\frac{1}{2}$ V in this embodiment). Therefore, an input vs. output characteristic of the first inverter 11 in the first inverter group circuit 15 is indicated by a one-dot-chain curve 33 and an input vs. output characteristic of the second inverter is depicted by a two-dot-chain curve 34. Accordingly, an input vs. output characteristic of the first inverter circuit 15 is depicted by a continuous curve 35. Therefore, the first inverter group circuit 15 has a threshold voltage $V_{TA}$ for the input signal Vi. As to the second inverter group circuit 16, an input vs. output characteristic of the third inverter 13 is plotted by a one-dot-chain curve 36 and an input vs. output characteristic of the fourth inverter 14 is plotted by a two-dot-chain curve 37. Therefore, the input vs. output characteristic of the second inverter group circuit 16 is plotted by a continuous curve 38. The second inverter group circuit 16 has the threshold voltage $V_{TB}$ for the input signal Vi. Here, a relation $V_{TB} < V_{TA}$ holds.

With the rise of the voltage waveform 40 of the input signal Vi shown in FIG. 4, a level of the input signal Vi reaches the threshold voltage VTB of the second inverter group circuit 14. At this time, the output voltage of the second inverter group circuit 16 is inverted from an L level to an H level. The threshold voltage $V_{TA}$ of the first inverter group circuit 15 is higher than the threshold voltage $V_{TB}$ of the second inverter group circuit 16, so that the output voltage of the first inverter group circuit is kept at the L level. Therefore, the output of the OR/NAND circuit 17 in the RS F/F 20 is not level-inverted, or remains the H level. Accordingly, the output voltage of the inverter 19 is held at the L level. At time t2 when the input signal Vi reaches the threshold voltage $V_{TA}$ of the first inverter group circuit 15, the output of the first inverter group circuit 15 is inverted from the L level to the H level. As a result, the OR/NAND circuit 19 changes its output voltage level from the H to L level and the inverter 19 inverts its output level from L to H level.

Let us consider the falling step of the input signal Vi. At a time point t3 when the input signal Vi reaches the threshold voltage $V_{TA}$ of the first inverter group circuit 15, the output voltage of the first inverter group circuit 15 is inverted from the H level to the L level, while the output from the second inverter group circuit 16 yet keeps the H level. For this reason, the output voltages of the OR/NAND circuit 17 and the inverter 19 are not level-inverted. At a time point t4 when the level of the input signal Vi reaches the threshold voltage $V_{TB}$ of the second nverter group circuit 16, the output voltage of the second inverter group circuit 16 is inverted from the H level to the L level. As a result, the output of the OR/NAND circuit 17 is level-inverted from L to H level, while the output of the inverter 19 is inverted from the H level to the L level.

Figure 7:
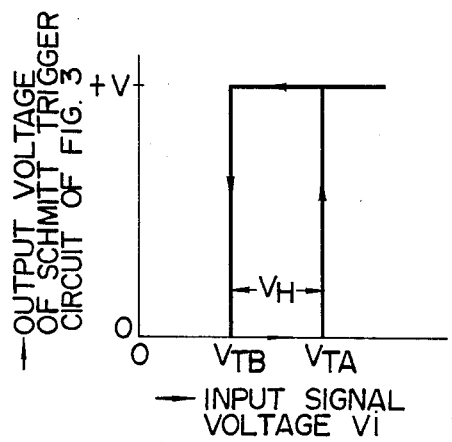
FIG. 7 shows input vs. output relationships of the circuits shown in FIG. 3.

As seen from the foregoing, the output voltage of the Schmitt trigger circuit shown in FIG. 3 exhibits a hysteresis characteristic as shown in FIG. 7 in accordance with the level of the input signal Vi. More specifically, when the input signal Vi rises to reach the threshold voltage $V_{TA}$ of the first inverter group circuit 15, the output of the inverter 19 is inverted from the L to H level. When the input signal Vi falls to reach the threshold voltage $V_{TB}$ of the second inverter group circuit 16, the output of the inverter 19 is level-inverted from H to L level. A hysteresis voltage width $V_H$ in the hysteresis characteristic is determined by a difference between the threshold voltage $V_{TA}$ of the first inverter group circuit 15 and the threshold voltage $V_{TB}$ of the second inverter group circuit 16. The threshold voltage value $V_{TA}$ of the first inverter group circuit 15 may be set by selectively changing the threshold voltages $V_{T1}$ and $V_{T2}$ of the first and second inverter 11 and 12. The threshold voltage value $V_{TB}$ of the second inverter group circuit 16 may be set by selectively changing the threshold voltages $V_{T3}$ and $V_{T4}$ of the third and fourth inverters. Therefore, the hysteresis voltage width $V_H$ can be set satisfactorily large.

The Schmitt trigger circuit incorporating the input signal level detecting circuit according to the present invention will be suited for an integrated circuit fabrication by CMOS transistors. Specifically, the threshold voltages of the MOS transistors of both the P and N channal types can be fabricated with little variation in the specification. Parameters in the manufacturing stage such as carrier mobility may be considered as substantially the same for the MOS transistors. Therefore, the threshold voltages of the MOS transistors may be set to given values, by merely changing a ratio of a channel width to channel length (W/L) of each transistor. Accordingly, to set high the threshold voltage of a specific inverter of those inverters 11 to 14, the channel width W of the N channel transistor constituting the CMOS transistor in the inverter is made large or the channel length L is made small. Alternately, the same is attained by making the channel length L of the P channel transistor large or making its channel width W small. Conversely, to set low the threshold voltage of a given inverter, the channel width W of the N channel transistor constituting the CMOS transistor of the inverter is made small or the channel length L is made large. Alternately, the channel length L of the P channel transistor is made large or the channel width W is made large for the same purpose.

When the inverters 11 to 14 are constructed of CMOS transistors, a slope of the change in an output voltage of an inverter is more steep than a slope of an input to the inverter. Therefore, in the Schmitt trigger circuit incorporating the level detecting circuit according to the present invention, threshold voltage values of the inverter group circuits 15 and 16 at the rise and fall times of the input signals are respectively coincident with the corresponding set threshold values with high precisions. This also indicates that little error takes place in the set hysteresis voltage width $V_H$. The threshold voltage of each inverter, i.e. the CMOS, changes depending on the fabricating conditions of the CMOS's, but the change in this case is small, as mentioned above. Therefore, the deviations of the hysteresis voltage width from the set width, which arise from the change of the fabricating condition, is also extremely small. The threshold voltage value of each inverter circuit is compensated, by means of at least two stages of inverters constituting the inverter circuit, so as to provide a given set value. Therefore, a change of a center value of the hysteresis voltage width $V_H$ (the center value between the voltages $V_{TB}$ and $V_{TA}$ in FIG. 7) is also extremely small.

Figure 8:
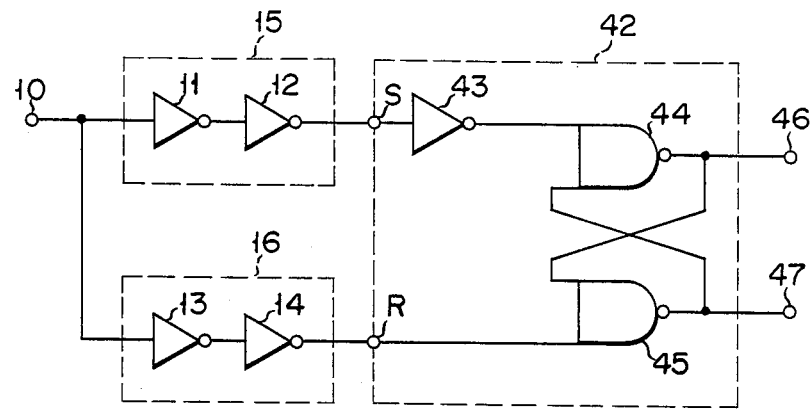
FIG. 8 is a block diagram of another embodiment of a Schmitt trigger circuit incorporating an input signal level detecting circuit according to the present invention.

The RS F/F shown in FIG. 2 can be modified into the one with a structure shown in FIG. 8. In FIG. 8, a set terminal S is connected to an input terminal of an inverter 43 comprised of CMOS's transistor, whose output is connected to one of the input terminals of a NAND gate 44. The NAND gate 44 is connected at the output terminal to a set output terminal 46 of the F/F circuit 42. A reset terminal R is connected to one of the input terminals of a NAND gate 45. An output terminal of the NAND gate 44 is coupled with the other input terminal of the NAND gate 45 of which the output terminal is connected to the reset output terminal 47 of the F/F circuit. The output terminal of the NAND gate 44 is connected to the other input terminal of the NAND gate 45. The output terminal of the NAND gate 45 is connected to the other input terminal of the NAND gate 44. The operation and effect of the Schmitt trigger circuit using the RS F/F are the same as those of that of FIG. 2.

An embodiment when a Schmitt trigger circuit incorporating the present invention is further applied to an oscillator will be described with reference to FIGS. 9A to 9D. In these figures, inverters 11a and 12a form a first inverter group circuit 15a, while inverters 13a and 14a form a second inverter group circuit 16a. The inverter 13a is made up of CMOS's as shown in FIG. 9B, in which a P type MOS transistor 13a1 receives at the source a voltage $V_{DD}$, and an N type MOS transistor 13a2 receives at the source a voltage $V_{SS}$ (an earth voltage E in this example). An adjustable control voltage is applied to a back gate electrode 56 of the transistor 13a2. The constructions of the inverters 11a, 12a and 14a are the same as those of the inverters 11, 12 and 14 in FIG. 3, respectively. Therefore, no explanation of those inverters will be given. The RS F/F 20a includes an AND/NOR gate 50 receiving the outputs of the first and second inverter group circuits 15a and 16a and a NOR gate 51 receiving an output of the AND/NOR gate 50. An output of the NOR gate 51 is applied to an inverter 52 and also fed back to the AND/NOR gate 50. An output terminal of the inverter 52 is connected to a power source E, via a resistor R1 and a capacitor 55. The input terminal 57 of the NOR gate 51 is used as a reset terminal for stopping an oscillation of the oscillating circuit under discussion. A connection point 54 between the resistor R1 and the capacitor 55 is coupled with input terminals of the inverters 11a and 13a. The back gate terminal 56 of the inverter 13a is connected to the power source E via a variable resistor R2, such that small changes in the potential present at terminal may be effected.

Figure 9A:
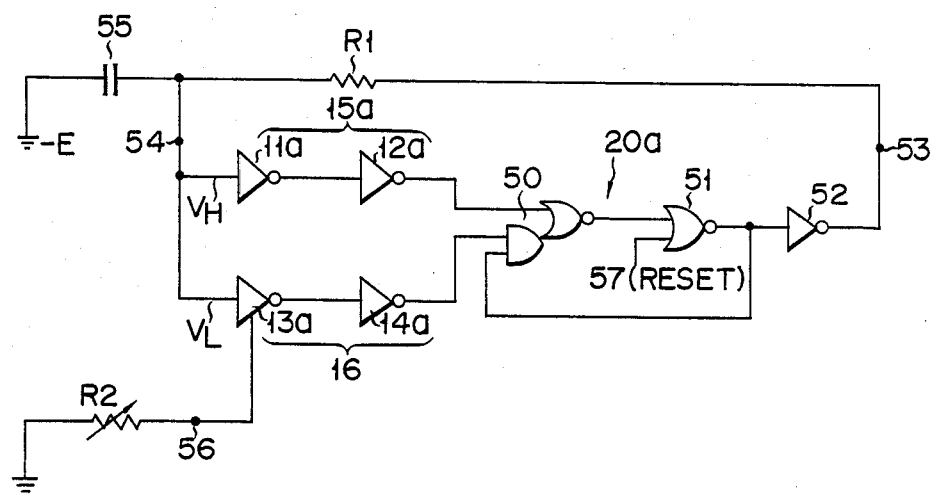
FIG. 9A is a circuit diagram of an embodiment when a Schmitt trigger circuit using a level detecting circuit according to the present invention is applied to an oscillator.
Figure 9B:
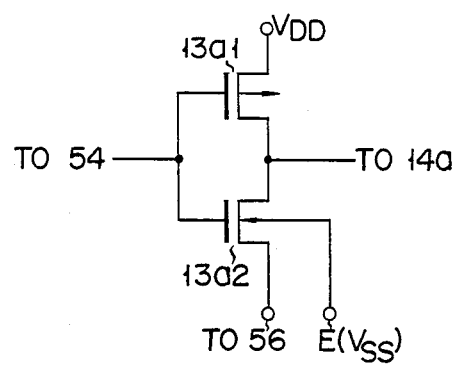
FIG. 9B is a circuit diagram of an inverter 13a used in the circuit of FIG. 9A.
Figure 9C:
FIGS. 9C and 9D are waveforms useful in explaining the operation of the circuit of FIG. 9A.
Figure 9D:
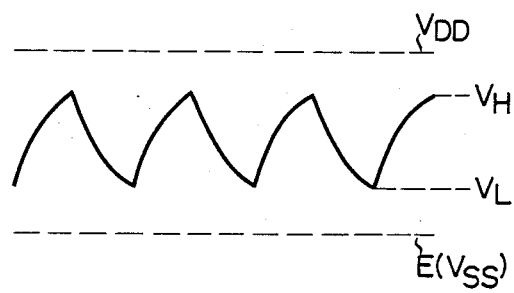

During the course of an oscillation of the FIG. 9A circuit, a waveform at an output terminal 53 of the inverter 52 is as shown in FIG. 9C. A waveform present between the junction point 54 and the power source E is a sawtooth waveform as shown in FIG. 9D. A top peak level of the sawtooth waveform is $V_H$, while a bottom peak level is $V_L$. Both the levels are within a range from the power source $V_{DD}$ to the power source E. The first inverter group circuit 15a is provided for detecting the high level $V_H$, while the inverter group circuit 16a for the low level $V_L$. The threshold voltages of the first and second inverter group circuits 15a and 16a may be set at any desired levels, as described with reference to FIG. 3. The set values are very stable, thus providing a stably operating oscillating circuit. It is noted that adjustments in the oscillation frequency can be accomplished, as desired, by adjusting resistor R2 and thereby affecting the potential at terminal 56 of inverter 13a.

What is claimed is:

1. An input signal level detecting circuit for receiving an input signal having a rising region including a first threshold level to be detected and a falling region including a second threshold level to be detected, the first threshold level being greater than the second threshold level, the circuit comprising:

a first inverter group circuit connected between a signal input terminal to which the input signal is applied and a first output terminal, said first inverter group circuit including at least a first inverter having an input connected to said signal input terminal and a second inverter having an input connected to an output of said first inverter;

a second inverter group circuit connected between said signal input terminal and a second output terminal, said second inverter group circuit including at least a third inverter having an input connected to said signal input terminal and a fourth inverter having an input connected to an output of said third inverter; and a set-reset flip-flop circuit including a plurality of CMOS-FET's (complementary oxide semiconductor field effect transistors), said flip-flop circuit having input terminals connected to said first and second output terminals of said first and second inverter group circuits, each of said first through fourth inverters being formed of CMOS-FET's and being structured to have a predetermined threshold voltage associated therewith, the threshold voltages of each of said first through fourth inverters being determined relative to a reference level defined by the mean level of said first and second levels, wherein the threshold voltage of said first inverter is higher than said reference level, that of said second inverter is lower than said reference level, that of said third inverter is lower than said reference level, and that of said fourth inverter is higher than said reference level.

2. An input signal level detecting circuit according to claim 1, in which said set-reset flip-flop circuit includes an OR/NAND gate for receiving outputs from said first and second inverter group circuits and an inverter for receiving an output from said OR/NAND gate and feeding back the output of said inverter to said OR/NAND gate.

3. An input signal level detecting circuit according to claim 1, in which said set-reset flip-flop circuit includes an inverter for receiving an output from said first inverter group circuit, a first two-input NAND gate for receiving at one input terminal an output from said inverter to produce a set output, and a second two-input NAND gate for receiving at one input terminal an output of said second inverter group circuit to produce a reset output, the output of said first two-input NAND gate being supplied to the other input of said second two-input NAND gate, and the output of said second NAND gate being supplied to the other input terminal of said first two-input NAND gate.

* * * * *